(12) United States Patent
Wang et al.

(10) Patent No.: US 12,235,723 B2
(45) Date of Patent: Feb. 25, 2025

(54) DATA RECONSTRUCTION METHOD BASED ON ERASURE CODING, AN APPARATUS, A DEVICE AND A STORAGE MEDIUM

(71) Applicant: INSPUR SUZHOU INTELLIGENT TECHNOLOGY CO., LTD., Suzhou (CN)

(72) Inventors: Qinghai Wang, Shandong (CN); Xiangrui Meng, Shandong (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/029,700

(22) PCT Filed: Sep. 28, 2021

(86) PCT No.: PCT/CN2021/121225
§ 371 (c)(1),
(2) Date: May 14, 2024

(87) PCT Pub. No.: WO2022/105442
PCT Pub. Date: May 27, 2022

(65) Prior Publication Data
US 2024/0045763 A1 Feb. 8, 2024

(30) Foreign Application Priority Data
Nov. 19, 2020 (CN) .......................... 202011305572.2

(51) Int. Cl.
*G06F 11/00* (2006.01)
*G06F 11/10* (2006.01)
(Continued)

(52) U.S. Cl.
CPC ...... *G06F 11/1088* (2013.01); *G06F 11/1448* (2013.01); *H03M 13/373* (2013.01)

(58) Field of Classification Search
CPC ............. G06F 11/1088; G06F 11/1092; G06F 11/1076; G06F 11/1048; H03M 13/373
See application file for complete search history.

(56) References Cited

U.S. PATENT DOCUMENTS 11,288,140 B2 * 3/2022 Paramasivam Balakrishnan ........ G06F 11/1471
2017/0083244 A1 * 3/2017 Reinart .................. G06F 3/064
(Continued)

FOREIGN PATENT DOCUMENTS

CN  103645861 A  3/2014
CN  103955343 A  7/2014
(Continued)

OTHER PUBLICATIONS

Abd-El-Malek, Michael et al., Ursa Minor: versatile cluster-based storage, 2005, Usenix (Year: 2005).*
(Continued)

*Primary Examiner* — Marc Duncan
(74) *Attorney, Agent, or Firm* — DINSMORE & SHOHL LLP (57) ABSTRACT

The present application discloses a data reconstruction method based on erasure coding, an apparatus, a device and a storage medium. The method comprise the following steps: acquiring data offset information of incremental data in a data object; acquiring corresponding data segments from a plurality of source OSDs according to the data offset information; wherein, the source OSDs are target OSDs storing incremental data among respective OSDs storing data objects based on erasure coding, and a quantity of the source OSDs is the same as a quantity of data disks corresponding to the erasure coding; integrating the data segments into an erasure incremental segment, and writing the erasure incremental segment into a to-be-reconstructed OSD, which has no incremental data stored therein, among (Continued)

the respective OSDs. The present method reduces the data volume of data reconstruction, and further ensures the overall efficiency of data reconstruction. In addition, the present application also discloses a data reconstruction apparatus based on erasure coding, a device and a storage medium, with the same beneficial technical effects as above.

19 Claims, 2 Drawing Sheets

(51) Int. Cl.
  *G06F 11/14* (2006.01)
  *H03M 13/37* (2006.01)

(56) References Cited

U.S. PATENT DOCUMENTS

2018/0157671 A1   6/2018   Eda et al.
2021/0303399 A1*  9/2021   Jarvis .................... G06F 3/0619

FOREIGN PATENT DOCUMENTS

| CN | 105930103 A | 9/2016 |
| CN | 108664351 A | 10/2018 |
| CN | 109213637 A | 1/2019 |
| CN | 110019408 A | 7/2019 |
| CN | 110263932 A | 9/2019 |
| CN | 112463434 A | 3/2021 |

OTHER PUBLICATIONS

Muralidhar, Subramanian et al., f4: Facebook's Warm BLOB Storage System, 2014, Usenix (Year: 2014).*
Mesnier, Mike et al., Object-based storage: Pushing more functionality into storage, 2005, IEEE (Year: 2005).*
International Search Report and Written Opinion issued by China National Intellectual Property Administration dated on Jan. 6, 2022 ( 6 total pages).

* cited by examiner

DATA RECONSTRUCTION METHOD BASED ON ERASURE CODING, AN APPARATUS, A DEVICE AND A STORAGE MEDIUM

The present application claims priority of International Patent Application No. PCT/CN2021/121225, filed on Sep. 28, 2021, which claims priority to Chinese patent application No. 202011305572.2, filed to the CNIPA on Nov. 19, 2020 and entitled "A Data Reconstruction Method based on Erasure Coding, an Apparatus, a Device and a Storage Medium", the entireties of which are incorporated herein by reference.

TECHNICAL FIELD

The present application relates to the technical field of distributed storage, and particularly relates to a data reconstruction method based on erasure coding, an apparatus, a device and a storage medium.

BACKGROUND

Object-based Storage is a novel kind of network storage architecture, a device based on the technique of Object-based Storage is an Object-based Storage Device, abbreviated as OSD. In a distributed file system, the main functions of OSDs are data storage, data duplication, data balance, and data restoration, etc. Generally, an OSD corresponds to a disk, the OSD is used for management of disk storage. When the disk loaded with an OSD is in permanent breakdown, the data of the OSD needs to be restored, and the process of restoring the data of the faulty OSD from other OSDs is called data reconstruction.

Erasure coding (i.e., EC) is a kind of method for data protection, it divides data into segments, extends and encodes redundant data blocks and restores them to different locations, such as disks, storage nodes, or other geographical locations. The data protection provided by erasure coding can be represented by the formula K+M, wherein, K is the amount of data disks, M is the amount of check disks, and at most M disks are allowed to be faulty.

In the situation of applying the data storage scheme of erasure coding to a distributed file system of data object storage, because data in each OSD member storing a data object is unique, therefore, the data restoration of a data object in the prior art is reconstructing the entirety of the data object. Thus, for the scheme of storing data based on erasure coding in a distributed file system, the data volume of reading and writing is large in the process of data reconstruction, and the overall efficiency of data reconstruction is difficult to be ensured.

Thus, it can be seen that, how to provide a data reconstruction method based on erasure coding in order to relatively ensure the overall efficiency of data reconstruction is a technical problem needed to be solved by technicians in this technical field.

SUMMARY

The purpose of the present application is to provide a data reconstruction method based on erasure coding, an apparatus, a device and a storage medium in order to relatively ensure the overall efficiency of data reconstruction.

For solving the above-mentioned technical problem, the present application provides a data reconstruction method based on erasure coding, comprising:

acquiring data offset information of incremental data in a data object;

acquiring corresponding data segments from a plurality of source OSDs according to the data offset information; wherein, the source OSDs are target OSDs storing incremental data among respective OSDs storing data objects based on erasure coding, and a quantity of the source OSDs is the same as a quantity of data disks corresponding to the erasure coding;

integrating the data segments into an erasure incremental segment, and writing the erasure incremental segment into a to-be-reconstructed OSD, which has no incremental data stored therein, among the respective OSDs.

In some embodiments, the data offset information comprises an offset start address and an offset data length; and correspondingly, the step of acquiring corresponding data segments from a plurality of source OSDs according to the data offset information comprises:

acquiring an erasure offset start address by equally dividing the offset start address in accordance with the quantity of the data disks, and acquiring an erasure offset data length by equally dividing the offset data length in accordance with the quantity of the data disks;

acquiring the corresponding data segments from the plurality of source OSDs according to the erasure offset start address and the erasure offset data length.

In some embodiments, before the step of acquiring an erasure offset data length by equally dividing the offset data length in accordance with the quantity of the data disks, the method further comprises:

determining whether the offset data length is an integral multiple of an erasure band data length corresponding to the erasure coding;

if the offset data length is an integral multiple of the erasure band data length corresponding to the erasure coding, then performing the step of acquiring an erasure offset data length by equally dividing the offset data length in accordance with the quantity of the data disks;

if the offset data length is not an integral multiple of the erasure band data length corresponding to the erasure coding, then increasing the offset data length to an integral multiple of the erasure band data length, and performing the step of acquiring an erasure offset data length by equally dividing the increased offset data length in accordance with the quantity of the data disks based on the increased offset data length.

In some embodiments, when an item quantity of the data offset information is more than 1, before the step of writing the erasure incremental segment into a to-be-reconstructed OSD, which has no incremental data stored therein, among the respective OSDs, the method further comprises:

storing the erasure incremental segments corresponding to items of the data offset information as a consecutive data section, and recording the position information of each of the erasure incremental segments in the data section;

correspondingly, the step of writing the erasure incremental segment into a to-be-reconstructed OSD, which has no incremental data stored therein, among the respective OSDs comprises:

writing the respective erasure incremental segments, read from the data section according to the position information, into the to-be-reconstructed OSD, which has no incremental data stored therein, among the respective OSDs.

In some embodiments, the step of writing the erasure incremental segment into a to-be-reconstructed OSD, which has no incremental data stored therein, among the respective OSDs comprises:

writing the erasure incremental segment into an address range, corresponding to the offset start address and the offset data length, in the to-be-reconstructed OSD.

In some embodiments, the step of acquiring data offset information of incremental data in a data object comprises:

acquiring the data offset information of the incremental data in the data object from a writing operation log of a placement group in which the data object is placed.

In addition, the present application further provides a data reconstruction apparatus based on erasure coding, the apparatus comprises:

an offset information acquisition module, for acquiring data offset information of incremental data in a data object;

a data segment acquisition module, for acquiring corresponding data segments from a plurality of source OSDs according to the data offset information; wherein, the source OSDs are target OSDs storing incremental data among respective OSDs storing data objects based on erasure coding, and a quantity of the source OSDs is the same as a quantity of data disks corresponding to the erasure coding;

an incremental segment storage module, for integrating the data segments into an erasure incremental segment, and writing the erasure incremental segment into a to-be-reconstructed OSD, which has no incremental data stored therein, among the respective OSDs.

In some embodiments, the data offset information comprises an offset start address and an offset data length; and correspondingly, the data segment acquisition module comprises:

an address range acquisition module, for acquiring an erasure offset start address by equally dividing the offset start address in accordance with the quantity of the data disks, and acquiring an erasure offset data length by equally dividing the offset data length in accordance with the quantity of the data disks;

a range data acquisition module, for acquiring the corresponding data segments from the plurality of source OSDs according to the erasure offset start address and the erasure offset data length.

In addition, the present application further provides a data reconstruction device based on erasure coding, the device comprises:

a memory, for storing a computer program;

a processor, for executing the computer program to implement the steps of the aforementioned data reconstruction method based on erasure coding.

In addition, the present application further provides a computer readable storage medium, the computer readable storage medium stores a computer program, the computer program is configured to be executed by a processor to implement the aforementioned data reconstruction method based on erasure coding.

In the data reconstruction method based on erasure coding provided by the present application, firstly, data offset information of incremental data in a data object is acquired, then, corresponding data segments are acquired from a plurality of source OSDs according to the data offset information, wherein the source OSDs are target OSDs storing incremental data among respective OSDs storing data objects based on erasure coding, and a quantity of the source OSDs is the same as a quantity of data disks corresponding to the erasure coding, and after the data segments are acquired, the data segments are further integrated into an erasure incremental segment, and the erasure incremental segment is written into a to-be-reconstructed OSD, which has no incremental data stored therein, among the OSDs. Because the present method, in a scenario of a distributed file system that stores objects based on a mode of erasure coding, realizes that the source OSDs, which have incremental data of a data object stored therein, are utilized for data reconstruction of erasure incremental segment to reconstruct the incremental data portion of a to-be-reconstructed OSD, which has no incremental data stored therein, as compared with the way of performing data reconstruction for an entire data object, the present method reduces the data volume of data reconstruction, and further ensures the overall efficiency of data reconstruction. Furthermore, the present application further provides a data reconstruction apparatus based on erasure coding, a device and a storage medium, having the same beneficial technical effects as the above-mentioned effects.

BRIEF DESCRIPTION OF DRAWINGS

For more clearly explaining the embodiments of the present application, the drawings that need to be used in describing the embodiments will be briefly introduced hereinafter. Apparently, the drawings described hereinafter are merely some embodiments of the present application, for a person with ordinary skill in the art, other drawings can be derived based on these drawings.

FIG. 3.a is a schematic diagram of a data segment, which is disclosed by a scenario embodiment of the present application;

FIG. 3.b is a schematic diagram of a data segment, which is disclosed by a scenario embodiment of the present application;

DETAILED DESCRIPTION

Hereinafter, the technical solutions in the embodiments of the present application are clearly and completely described, with reference to the appended drawings of the embodiments of the present application. Apparently, the embodiments described hereinafter are merely a portion of embodiments of the present application rather than all embodiments. According to the embodiments described in the present application, all other embodiments obtained by a person with ordinary skill in the art without creative efforts shall belong to the protection scope of the present application.

In a situation of applying the data storage scheme of erasure coding to a distributed file system of data object storage, because data in each OSD member storing a data object is unique, therefore, the data restoration of a data object in the prior art is reconstructing the entirety of the data object. Thus, for the scheme of storing data based on erasure coding in a distributed file system, the data volume of reading and writing is large in the process of data reconstruction, and the overall efficiency of data reconstruction is difficult to be ensured.

Therefore, the core of the present application is to provide a data reconstruction method based on erasure coding to relatively ensure the overall efficiency of data reconstruction.

For the technical solution of the present application to be better understood by a person skilled in the art, the present application is hereinafter further described in detail in conjunction with the appended drawings and the specific embodiments.

Figure 1:
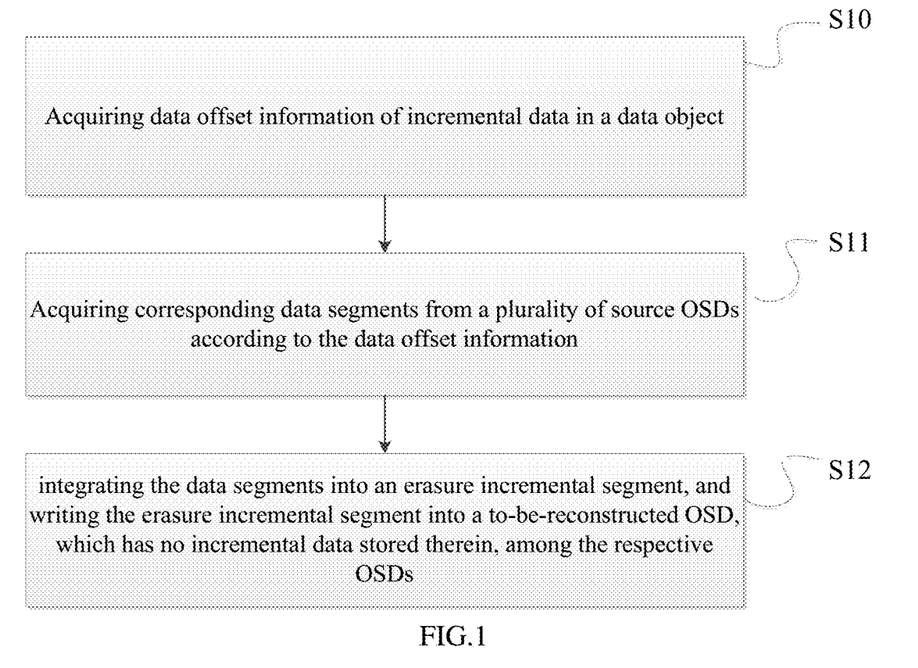
FIG. 1 is a flowchart of a data reconstruction method based on erasure coding, which is disclosed by an embodiment of the present application.

FIG. 1 shows that, an embodiment of the present application discloses a data reconstruction method based on erasure coding, the method comprises:

step S10: acquiring data offset information of incremental data in a data object.

It should be noted that the data object in this step is collectively stored by a plurality of OSDs (Object-based Storage Device) based on erasure coding storage mechanism. Logically, the data object is an entirety of data. On this basis, incremental data refers to the data that has changed in the data object, the incremental data is a portion of the data in the data object, and the data offset information represents the offset location where the incremental data is located in the data object.

step S11: acquiring corresponding data segments from a plurality of source OSDs according to the data offset information.

Wherein, the source OSDs are target OSDs storing incremental data among respective OSDs storing data objects based on erasure coding, and a quantity of the source OSDs is the same as a quantity of data disks corresponding to the erasure coding.

After acquiring the data offset information of the incremental data in the data object, in this step, the method further acquires corresponding data segments from the plurality of source OSDs according to the data offset information, wherein, the source OSDs are target OSDs storing incremental data among respective OSDs collectively storing data objects based on erasure coding.

Due to that, when a distributed object storage is carried out based on erasure coding, the data object is collectively stored and maintained by the plurality of OSDs in conformity with the quantity of disks meeting the requirements of erasure coding. Namely, the data stored in the plurality of OSDs can be collectively integrated as an entirety of the data object. Therefore, when a portion of data of the data object is changed to produce incremental data, the incremental data is still collectively stored by the plurality of OSDs with the corresponding quantity. On this basis, because the data protection provided by erasure coding can be represented by a formula K+M, wherein, K is the quantity of data disks, M is the quantity of check disks, at most M disks are allowed to be faulty. Thus, when a to-be-reconstructed OSD, in which the incremental data is not stored normally, exists among the OSDs, the incremental data that is absent in the to-be-reconstructed OSD can be reconstructed in the to-be-reconstructed OSD by means of the data segments of the incremental data from the K source OSDs in which the incremental data is stored.

step S12: integrating the data segments into an erasure incremental segment, and writing the erasure incremental segment into a to-be-reconstructed OSD, which has no incremental data stored therein, among the respective OSDs.

After acquiring corresponding data segments from the plurality of source OSDs in accordance with the data offset information, in this step, the method further integrates the data segments into an erasure incremental segment, then the erasure incremental segment is written into the to-be-reconstructed OSD.

In the data reconstruction method based on erasure coding provided by the present application, firstly, data offset information of incremental data in the data object is acquired, then, corresponding data segments are acquired from the plurality of source OSDs according to the data offset information, wherein the source OSDs are target OSDs storing incremental data among respective OSDs storing data objects based on erasure coding, and the quantity of the source OSDs is the same as the quantity of data disks corresponding to the erasure coding, and after the data segments are acquired, the data segments are further integrated into the erasure incremental segment, and the erasure incremental segment is written into the to-be-reconstructed OSD, which has no incremental data stored therein, among the OSDs. Because the present method, in a scenario of a distributed file system that stores objects based on a mode of erasure coding, realizes that the source OSDs, which have incremental data of a data object stored therein, are utilized for data reconstruction of erasure incremental segment to reconstruct the incremental data portion of a to-be-reconstructed OSD, which has no incremental data stored therein, as compared with the way of performing data reconstruction for an entire data object, the present method reduces the data volume of data reconstruction and further ensures the overall efficiency of data reconstruction.

On the basis of the embodiments hereinbefore, as an optional embodiment, the data offset information comprises an offset start address and an offset data length;

correspondingly, the step of acquiring corresponding data segments from a plurality of source OSDs according to the data offset information comprises:

acquiring an erasure offset start address by equally dividing the offset start address in accordance with the quantity of the data disks, and acquiring an erasure offset data length by equally dividing the offset data length in accordance with the quantity of the data disks;

acquiring the corresponding data segments from the plurality of source OSDs according to the erasure offset start address and the erasure offset data length.

In this embodiment, the data offset information comprises an offset start address and an offset data length, wherein, the offset start address refers to the data address corresponding to the start position of the incremental data; the offset data length refers to the address length occupied by the entire data of the incremental data. However, in consideration that the erasure coding evenly stores a data object in K data disks, the incremental data is thus also evenly stored in the respective data disks, therefore, when acquiring corresponding data segments from a plurality of source OSDs according to the data offset information, specifically, an erasure offset start address is acquired by equally dividing the offset start address based on the quantity of the data disks, and an erasure offset data length is acquired by equally dividing the offset data length based on the quantity of the data disks, and the corresponding data segments can thus be acquired from the plurality of source OSDs according to the erasure offset start address and the erasure offset data length. This embodiment further ensures the accuracy of the process of acquiring the corresponding data segments from the plurality of source OSDs.

On the basis of the embodiments hereinbefore, as an optional embodiment, before the step of acquiring an erasure offset data length by equally dividing the offset data length in accordance with the quantity of the data disks, the method further comprises:

determining whether the offset data length is an integral multiple of an erasure band data length corresponding to the erasure coding;

if the offset data length is an integral multiple of the erasure band data length corresponding to the erasure coding, then performing the step of acquiring an erasure offset data length by equally dividing the offset data length in accordance with the quantity of the data disks;

if the offset data length is not an integral multiple of the erasure band data length corresponding to the erasure coding, then increasing the offset data length to an integral multiple of the erasure band data length, and performing the step of acquiring an erasure offset data length by equally dividing the increased offset data length in accordance with the quantity of the data disks based on the increased offset data length.

It should be explained that, in this embodiment, in consideration that the erasure coding usually stores the data object in units of erasure bands. Thus, when a data change occurred in the data object and the incremental data is generated, the size of the incremental data should be an integral multiple of the size of the erasure band, thus, before acquiring an erasure offset data length by equally dividing the offset data length in accordance with the quantity of the data disks, it is determined whether the offset data length is an integral multiple of an erasure band data length corresponding to the erasure coding. If the offset data length is an integral multiple of the erasure band data length corresponding to the erasure coding, then the step of acquiring an erasure offset data length by equally dividing the offset data length in accordance with the quantity of the data disks is further performed; if the offset data length is not an integral multiple of the erasure band data length corresponding to the erasure coding, then the offset data length is increased to an integral multiple of the erasure band data length, and the step of acquiring an erasure offset data length by equally dividing the increased offset data length in accordance with the quantity of the data disks based on the increased offset data length is further performed. This embodiment further ensures the accuracy of the erasure offset data length acquired by equally dividing the offset data length based on the quantity of data disks.

In addition, as an optional embodiment, when an item quantity of the data offset information is more than 1, before writing the erasure incremental segment into a to-be-reconstructed OSD, which has no incremental data stored therein, among the respective OSDs, the method further comprises:

storing the erasure incremental segments corresponding to items of the data offset information as a consecutive data section, and recording the position information of each of the erasure incremental segments in the data section;

correspondingly, the step of writing the erasure incremental segment into a to-be-reconstructed OSD, which has no incremental data stored therein, among the respective OSDs, comprises:

writing the respective erasure incremental segments, read from the data section according to the position information, into the to-be-reconstructed OSD, which has no incremental data stored therein, among the respective OSDs.

It should be explained that, when an item quantity of the data offset information is more than 1, it indicates that a plurality of incremental data items exist in the data object, therefore, a plurality of erasure incremental segments corresponding to the plurality of incremental data items are generated, thus, before writing the erasure incremental segments into a to-be-reconstructed OSD, which has no incremental data stored therein, among the respective OSDs, this embodiment firstly stores the erasure incremental segments corresponding to items of the data offset information as a consecutive data section, and records the position information of each of the erasure incremental segments in the data section, wherein, the consecutive data section refers to a consecutive data address range occupied by the data of the data segments, and what is recorded in the position information is the data address sub-range corresponding to each of the erasure incremental segments in the data section, then the step of writing the erasure incremental segment into a to-be-reconstructed OSD, which has no incremental data stored therein among the respective OSDs is specifically performed by writing the erasure incremental segments, read from the data section based on the position information, into the to-be-reconstructed OSD, which has no incremental data stored therein, among the respective OSDs. This embodiment further ensures the accuracy of the process of writing the erasure incremental segment into a to-be-reconstructed OSD, which has no incremental data stored therein, among the respective OSDs.

In addition, as an optional embodiment, the step of writing the erasure incremental segment into a to-be-reconstructed OSD, which has no incremental data stored therein, among the respective OSDs comprises:

writing the erasure incremental segment into an address range, corresponding to the offset start address and the offset data length, in the to-be-reconstructed OSD.

In this embodiment, when writing the erasure incremental segment into a to-be-reconstructed OSD, which has no incremental data stored therein, among the respective OSDs, it is specifically performed by writing the erasure incremental segment into the address range, corresponding to the offset start address and the offset data length, in the to-be-reconstructed OSD, so that the accuracy of the process of writing the erasure incremental segment into a to-be-reconstructed OSD, which has no incremental data stored therein, among the respective OSDs is further ensured.

In addition, on the basis of a set of the embodiments hereinbefore, as an optional embodiment, the step of acquiring data offset information of incremental data in a data object comprises:

acquiring the data offset information of the incremental data in the data object from a writing operation log of a placement group in which the data object is placed.

After the writing operation leads to a change of data content of a data object, this embodiment stores the data offset information of the incremental data into a writing operation log of the placement group in which the data object is placed, then, when acquiring data offset information of incremental data in a data object, it is specifically performed by acquiring the data offset information of the incremental data in the data object from a writing operation log of a placement group in which the data object is placed. This embodiment further ensures the accuracy of acquiring the data offset information.

For deeper understanding of the embodiments hereinbefore, the present application further provides a scenario embodiment in a specific application scenario.

As an example, a data object has a data volume of 4M, a 4+2 erasure coding, and a unit of erasure band of 32K. For example, the six OSDs loaded with the data object are [2, 13, 25, 39, 46, 61], wherein, the nodes of OSD.39 and OSD.61 have been restarted, so the data version of OSD.39 and OSD.61 falls behind and needs to be restored. If the technical solution in the art is followed, OSD.2 is taken as the master OSD, a read request is sent to OSD.2, OSD.13, OSD.25, and OSD.46 to respectively read 1M data therefrom, and then the data (respectively, 1M) required by OSD.39 and OSD.61 is decoded by using the acquired 4M data, then the decoded data is respectively sent to OSD.39 and OSD.61.

Figure 2:
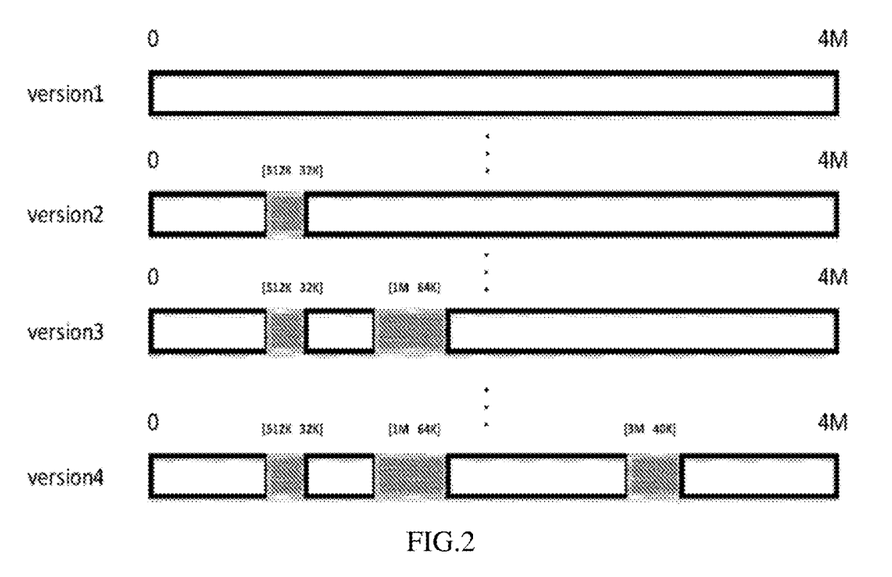
FIG. 2 is a schematic diagram of generating incremental data of a data object, which is disclosed by an embodiment of the present application.

Hereinafter, the method of implementing incremental data reconstruction based on erasure coding in a scenario of fault is explained by an example in which the schematic diagram of generating the incremental data of the data object is shown in FIG. 2.

The version of the data object (Object) is version 1, by this time, the OSDs [2, 13, 25, 39, 46, 61] loaded with the data object are all normal. The writing operations to PGs are recorded in a log which is named as pg_log. the Object is stored on pg 1.2d, and OSDs [2, 13, 25, 39, 46, 61] are six members of the pg 1.2d. Each time of modification to the Object is recorded in the pg_log, i.e., the modification thereof is recorded in the pg_log of the respective OSDs among the OSDs [2, 13, 25, 39, 46, 61]. Assuming that, at this time, OSD.39 malfunctions, then 32K of data is modified at a location that is offset by 512K in the data object (Object), by this time, the version of the data object is changed to be version 2, and by this time, the pg_log in OSDs [2, 13, 25, NONE, 46, 61] records this modification as {Object, version 2, [512K, 32K]}. After that, 64K of data is modified at a location that is offset by 1M in the data object, the version of the data object is changed to be version 3, by this time, the pg_log of OSDs [2, 13, 25, NONE, 46,61] records this modification as {Object, version 3, [1M, 64K]}. After that, OSD.61 malfunctions, and then 40K of data is modified at a location that is offset by 3M in the data object, the version of the data object is changed to be version 4, the pg_log of OSDs [2, 13, 25, NONE, 46, NONE] records this modification as {Object, version 4, [3M, 40K]}. After restarting OSD.39 and OSD.61, OSD.2 can know that OSD.39 lacks three versions, including version 2, version 3, and version 4, of the data object (Object); OSD.61 lacks version 4 of the data object (Object). For restoring these versions, the version data required by OSD.39 and OSD.61 need to be decoded by reading data from the four OSDs that are not faulty.

1. The procedures of configuring the read request are as follows:
   (1) the OSDs that need data restoration and the missing data thereof are recorded (in a form of a map), according to the pg_log.
   the data that need to be restored for OSD.39 and OSD.61 is recorded as:
   <
   <OSD.39, {Object, [512K,32K], [1M,64K], [3M,40K]}>,
   <OSD.61, {Object, [3M, 40K]}>
   >;
   (2) performing a Union operation on the missing data sections of the plurality of OSDs which need data restoration,
   for example, the missing data section of OSD.39 is: {Object, [512K, 32K], [1M,64K], [3M,40K]},
   the missing data section of OSD.61 is: {Object, [3M,40K]},
   after the Union operation, the result is: {Object, [512K, 32K], [1M,64K], [3M,40K]}, Because the erasure coding organizes data in a minimum unit of erasure band, the offset address and length of data reading and writing should all be integral multiples of the erasure band. For the example with an erasure band of 32K, after an alignment operation according to the erasure band, the acquired Union set is:
   {Object, [512K, 32K], [1M, 64K], [3M, 64K]}.

From the above concept of erasure unit, the data stored in each OSD member is merely 1/k of the entire data object, thus the range of data object requested to be read by each read requests sent to each of the OSDs that are not faulty needs to be rectified, and the rectified results are as follows:
   <
   <OSD.2, {Object, [128K,8K], [256K,16K], [768K, 16K]}>,
   <OSD.13, {Object, [128K,8K], [256K,16K], [768K, 16K]}>,
   <OSD.25, {Object, [128K,8K], [256K,16K], [768K, 16K]}>,
   <OSD.46, {Object, [128K,8K], [256K,16K], [768K, 16K]}>
   >;
   (3) the data that need to be restored for OSD.39 and OSD.61 in the procedure (1) is also rectified in accordance with the erasure band and the erasure unit. The rectified results are as follow:
   <
   <OSD.39, {Object, [128K, 8K], [256K, 16K], [768K, 16K]}>,
   <OSD.61, {Object, [768K,16K]}>
   >.

2. The read request is sent to K normal OSDs:
   the data object and the segments of data object that need to be read from the respective normal OSDs, which are configured in the procedure (2) of the step 1, are sent to the respective OSDs;
   messages are sent to OSD.2, OSD.13, OSD.25, OSD.46 for reading the three segments [128K, 8K], [256K, 16K], [768K,16K] of data in the data object (Object).

3. The K normal OSDs read data from the local disks, and the read data is filled in the message sent to the master OSD:
   the technical solution in the prior art only reads one segment of data in this step (in the example given, 1M data needs to be read from each of the normal OSDs for a data object having a data volume of 4M), whereas a plurality of segments of data need to be read in the present technical solution, which are {Object, [128K, 8K], [256K, 16K], [768K, 16K]}, and 8K+16K+16K=40K data is read from each of OSD.2, OSD.13, OSD.25, and OSD.46.

Figure 3:
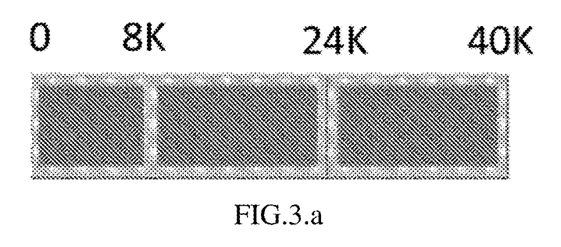

4. the master OSD decodes the data that needs to be restored according to K shares of data after receiving the K shares of data, and sending a message packaged with the data to the OSD(s) lacking the data:
   in the scenario of the given example, for the technical solution in the prior art, the master OSD has received four shares of 1M data respectively sent from four OSDs when restoring a 4M data object, the 1M data required by each of OSD.39 and OSD.61 is decoded from the four shares of data. Only one segment of data with 1M length is sent to each of OSD.39 and OSD.61. However, in the present technical solution, the data sent to each of the OSD(s) lacking data can be in a plurality of segments, which need to be processed, the procedures of processing are as follows:

(1) the plurality of segments of data sent from the normal OSDs are respectively decoded to obtain the data required by to-be-restored OSD(s);

it can be known from the procedure (3) of the step 1 that, only the data segment of [768K, 16K] of the data object (Object) needs to decoded for OSD.61;

three data segments [128K, 8K], [256K, 16K], and [768K, 16K] of the data object (Object) need to decoded for OSD.39;

(2) the decoded data segments are merged, and the information of the data segments is inserted into a table (map);

Because the restoration data to be sent to the OSD(s) that needs to be restored is saved in a bufferlist, the data is consecutively saved, the plurality of segments of data acquired by the procedure (2) thus need to be merged, and the information of the data segments is inserted into an information table. The merged data is named as Data, the information table of data segments is named as data_included. The schematic diagram of the data segments corresponding to OSD.39 is shown in FIG. 3.*a*, the schematic diagram of the data segments corresponding to OSD.61 is shown in FIG. 3.*b*;

(3) the merged data and the information table of data segments are sent to the respective to-be-restored OSD(s);

according to the data merged by the procedure (2), the data sent to OSD.39 is consecutive 40K merged data, and the information table {object111, [128K, 8K], [256K, 16K], [768K, 16K]} of data segments is sent to OSD.39, which is needed in step 5;

the data sent to OSD.61 is 16K, and the information table of data segment is {object111, [768K, 16K]}.

5. After receiving the data, the OSD(s) lacking the shares of data writes the received data into the local disk(s), then sends a response to the master OSD:

According to the scenario given by the example, the technical solution in the prior art would just write 1M data to the local disk(s) in the process of this step, the object is written into the location of [0, 1M], i.e., the 1M data is written at a starting position that is offset by 0 in the object;

Because of the requirement of the present technical solution that the plurality of segments of data need to be written into the local disk(s), the respective data segments need to be extracted from the received data (Data) in accordance with the information table (data_included), and then be written into the local disk(s), the specific procedures are as follows:

(1) initialing the offset=0;

(2) extracting the position information of a segment of data from the information table (data_included);

for example, when processing is done on OSD.39, the segment of [128K, 8K] is extracted from the information table (data_included) {[128K, 8K], [256K, 16K], [768K, 16K]}, wherein 128K is recorded as write_start, and 8K is recorded as data_len;

(3) a segment of data is extracted from the received data (Data), the position information of the extracted data is the same as the position information of the data segment in the procedure (2). When extracting data from the received data (Data), the start position of the extraction is offset, the extracted length is the data length (data_len) in the position information in the procedure (2);

by this time, the offset is 0, the data_len is 8K, i.e., the data from 0 to 8K is extracted from the received data (Data), which is named as write_data;

(4) the data segment (write_data) extracted by the procedure (3) is written in to a specific position in the object in the disk(s), i.e., the data is written into the object from the offset position which is write_start and lasting for the length which is data_len;

(5) offset+=data_len, wherein data_len needs to be added to the offset;

(5) if there is still data segment information that has not been processed in data_included, go to the procedure (2) for processing; and if all the data segment information in data_included has been processed, then this step is finished.

6. After the master OSD has received the response, the data restoration is finished.

Figure 4:
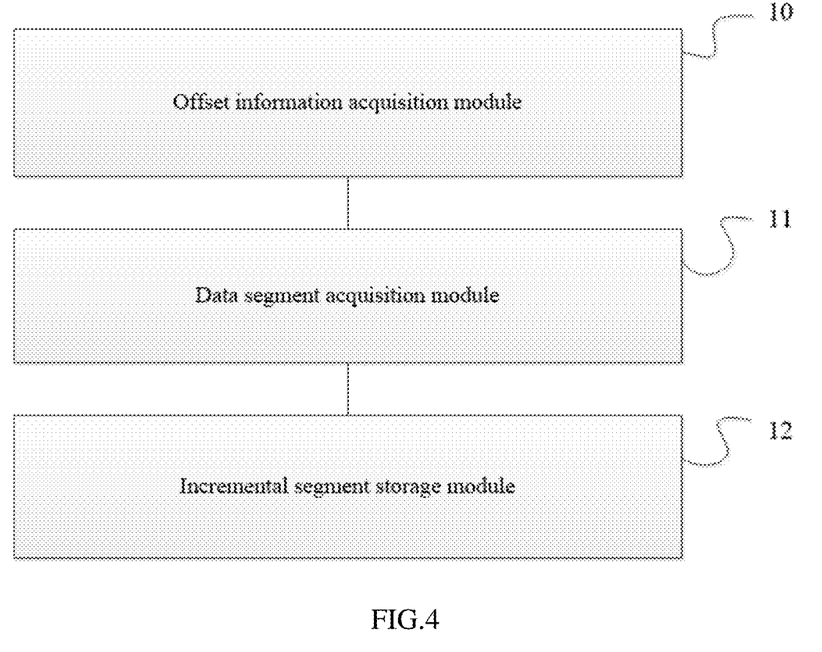
FIG. 4 is a structure schematic diagram of a data reconstruction apparatus based on erasure coding, which is disclosed by an embodiment of the present application.

As shown in FIG. 4, an embodiment of present application provides a data reconstruction apparatus based on erasure coding, comprising:

an offset information acquisition module 10, for acquiring data offset information of incremental data in a data object;

a data segment acquisition module 11, for acquiring corresponding data segments from a plurality of source OSDs according to the data offset information; wherein, the source OSDs are target OSDs storing incremental data among respective OSDs storing data objects based on erasure coding, and a quantity of the source OSDs is the same as a quantity of data disks corresponding to the erasure coding;

an incremental segment storage module 12, for integrating the data segments into an erasure incremental segment, and writing the erasure incremental segment into a to-be-reconstructed OSD, which has no incremental data stored therein, among the respective OSDs.

In addition, as an optional embodiment, the data offset information comprises an offset start address and an offset data length;

correspondingly, the data segment acquisition module comprises:

an address range acquisition module, for acquiring an erasure offset start address by equally dividing the offset start address in accordance with the quantity of the data disks, and acquiring an erasure offset data length by equally dividing the offset data length in accordance with the quantity of the data disks;

a range data acquisition module, for acquiring the corresponding data segments from the plurality of source OSDs according to the erasure offset start address and the erasure offset data length.

The data reconstruction apparatus based on erasure coding provided by the present application firstly acquires data offset information of incremental data in a data object; then acquires corresponding data segments from a plurality of source OSDs according to the data offset information, wherein the source OSDs are target OSDs storing incremental data among respective OSDs storing data objects based on erasure coding, and a quantity of the source OSDs is the same as a quantity of data disks corresponding to the erasure coding; after the data segments are acquired, further integrates the data segments into an erasure incremental segment, and writes the erasure incremental segment into a to-be-reconstructed OSD, which has no incremental data stored therein, among the OSDs. Because the present apparatus, in a scenario of a distributed file system that stores objects based on a mode of erasure coding, realizes that the source OSDs, which have incremental data of a data object stored therein, are utilized for data reconstruction of erasure incremental segment to reconstruct the incremental data portion of a to-be-reconstructed OSD, which has no incremental data stored therein, as compared with the way of performing data reconstruction for an entire data object, the present apparatus reduces the data volume of data reconstruction and further ensures the overall efficiency of data reconstruction.

In addition, the present application provides a data reconstruction device based on erasure coding, comprising:
a memory, for storing a computer program;
a processor, for executing the computer program to implement the steps of the data reconstruction method based on erasure coding as described hereinbefore.

The data reconstruction device based on erasure coding of the present application firstly acquires data offset information of incremental data in a data object; then acquires corresponding data segments from a plurality of source OSDs according to the data offset information, wherein the source OSDs are target OSDs storing incremental data among respective OSDs storing data objects based on erasure coding, and a quantity of the source OSDs is the same as a quantity of data disks corresponding to the erasure coding; after the data segments are acquired, further integrates the data segments into an erasure incremental segment, and writes the erasure incremental segment into a to-be-reconstructed OSD, which has no incremental data stored therein, among the OSDs. Because the present device, in a scenario of a distributed file system that stores objects based on a mode of erasure coding, realizes that the source OSDs, which have incremental data of a data object stored therein, are utilized for data reconstruction of erasure incremental segment to reconstruct the incremental data portion of a to-be-reconstructed OSD, which has no incremental data stored therein, as compared with the way of performing data reconstruction for an entire data object, the present device reduces the data volume of data reconstruction and further ensures the overall efficiency of data reconstruction.

In addition, the present application further provides a computer readable storage medium, the computer readable storage medium stores a computer program, the computer program is configured to be executed by a processor to implement the data reconstruction method based on erasure coding as described hereinbefore.

By means of the computer readable storage medium of the present application, firstly, data offset information of incremental data in a data object is acquired, then, corresponding data segments are acquired from a plurality of source OSDs according to the data offset information, wherein the source OSDs are target OSDs storing incremental data among respective OSDs storing data objects based on erasure coding, and a quantity of the source OSDs is the same as a quantity of data disks corresponding to the erasure coding, and after the data segments are acquired, the data segments are further integrated into an erasure incremental segment, and the erasure incremental segment is written into a to-be-reconstructed OSD, which has no incremental data stored therein, among the OSDs. Because the present computer readable storage medium, in a scenario of a distributed file system that stores objects based on a mode of erasure coding, realizes that the source OSDs, which have incremental data of a data object stored therein, are utilized for data reconstruction of erasure incremental segment to reconstruct the incremental data portion of a to-be-reconstructed OSD, which has no incremental data stored therein, as compared with the way of performing data reconstruction for an entire data object, the present computer readable storage medium reduces the data volume of data reconstruction and further ensures the overall efficiency of data reconstruction.

The data reconstruction method based on erasure coding, the apparatus, the device, and the storage medium, provided by the present application, are detailly described hereinbefore. The individual embodiments in the Specification are described using a progressive approach, each of the embodiments focuses on its differences as compared to other embodiments, the same and similar parts between the respective embodiments can refer to each other. For the apparatus disclosed in the embodiments, due to that the apparatus corresponds to the method disclosed in the embodiments, the apparatus is thus described relatively simply, and the corresponding parts can refer to the description of the method part for relevant information. It should be noted that, for a person with ordinary skill in the art, on the premise of not deviating from the principle of the present application, the present application can have various improvements and modifications, and such improvements and modifications also fall within the protection scope of the claims of the present application.

It should also be noted that, in the present Specification, relational terms such as first and second, etc., are used only to distinguish an entity or operation from another one, and do not necessarily require or imply any such actual relationship or sequence between such entities or operations. Furthermore, the terms "comprise", "include", or any other variation thereof is intended to cover non-exclusive inclusion, so that a process, a method, an article, or a device having a set of elements includes not only those elements, but also other elements not expressly listed or that are inherent to the process, method, article, or device. In the absence of further restrictions, an element defined by the statement "comprising a . . . " does not preclude the existence of another identical element in the process, method, article or device that comprises the said element.

What is claimed is:

1. A data reconstruction method based on erasure coding, wherein, the method comprises:
acquiring data offset information of incremental data in a data object;
acquiring corresponding data segments from a plurality of source object-based storage devices according to the data offset information; wherein, the source object-based storage devices are target object-based storage devices storing incremental data among respective object-based storage devices storing data objects based on erasure coding, and a quantity of the source object-based storage devices is the same as a quantity of data disks corresponding to the erasure coding;
integrating the data segments into an erasure incremental segment, and writing the erasure incremental segment into a to-be-reconstructed object-based storage device, which has no incremental data stored therein, among the respective object-based storage devices;
wherein, the data offset information comprises an offset start address and an offset data length;
the step of acquiring corresponding data segments from a plurality of source object-based storage devices according to the data offset information comprises:
acquiring an erasure offset start address by equally dividing the offset start address in accordance with the quantity of the data disks, and acquiring an erasure offset data length by equally dividing the offset data length in accordance with the quantity of the data disks;

acquiring the corresponding data segments from the plurality of source object-based storage devices according to the erasure offset start address and the erasure offset data length.

2. The data reconstruction method based on erasure coding according to claim 1, wherein, before the step of acquiring an erasure offset data length by equally dividing the offset data length in accordance with the quantity of the data disks, the method further comprises:
 determining whether the offset data length is an integral multiple of an erasure band data length corresponding to the erasure coding;
 if the offset data length is an integral multiple of the erasure band data length corresponding to the erasure coding, then performing the step of acquiring an erasure offset data length by equally dividing the offset data length in accordance with the quantity of the data disks;
 if the offset data length is not an integral multiple of the erasure band data length corresponding to the erasure coding, then increasing the offset data length to an integral multiple of the erasure band data length, and performing the step of acquiring an erasure offset data length by equally dividing the increased offset data length in accordance with the quantity of the data disks based on the increased offset data length.

3. The data reconstruction method based on erasure coding according to claim 2, wherein, the consecutive data section is a consecutive data address range occupied by the data of the data segments, and the data address range, corresponding to each of the erasure incremental segments in the data section, is recorded in position information.

4. The data reconstruction method based on erasure coding according to claim 1, wherein, when an item quantity of the data offset information is more than 1, before the step of writing the erasure incremental segment into a to-be-reconstructed object-based storage device, which has no incremental data stored therein, among the respective object-based storage devices, the method further comprises:
 storing the erasure incremental segments corresponding to items of the data offset information as a consecutive data section, and recording the position information of each of the erasure incremental segments in the data section;
 the step of writing the erasure incremental segment into a to-be-reconstructed object-based storage device, which has no incremental data stored therein, among the respective object-based storage devices comprises:
 writing the respective erasure incremental segments, read from the data section according to the position information, into the to-be-reconstructed object-based storage device, which has no incremental data stored therein, among the respective object-based storage devices.

5. The data reconstruction method based on erasure coding according to claim 1, wherein, the step of writing the erasure incremental segment into a to-be-reconstructed object-based storage device, which has no incremental data stored therein, among the respective object-based storage devices comprises:
 writing the erasure incremental segment into an address range, corresponding to the offset start address and the offset data length, in the to-be-reconstructed object-based storage device.

6. The data reconstruction method based on erasure coding according to claim 1, wherein, the step of acquiring data offset information of incremental data in a data object comprises:
 acquiring the data offset information of the incremental data in the data object from a writing operation log of a placement group in which the data object is placed.

7. The data reconstruction method based on erasure coding according to claim 1, wherein, the data object is collectively stored by a plurality of object-based storage devices based on erasure coding storage mechanism.

8. The data reconstruction method based on erasure coding according to claim 1, wherein, the incremental data is the data that has changed in the data object.

9. The data reconstruction method based on erasure coding according to claim 1, wherein, the incremental data is a portion of the data in the data object.

10. The data reconstruction method based on erasure coding according to claim 1, wherein, the data offset information represents the offset location where the incremental data is located in the data object.

11. The data reconstruction method based on erasure coding according to claim 1, after acquiring the data offset information of the incremental data in the data object, further comprising acquiring corresponding data segments from the plurality of source object-based storage devices according to the data offset information, wherein, the source object-based storage devices are target object-based storage devices storing incremental data among respective object-based storage devices collectively storing the data object based on erasure coding.

12. The data reconstruction method based on erasure coding according to claim 1, wherein, when a distributed object storage is carried out based on erasure coding, the data object is collectively stored and maintained by the plurality of object-based storage devices in conformity with the quantity of disks meeting the requirements of erasure coding, so as to cause the data stored in the plurality of object-based storage devices to be collectively integrated as an entirety of the data object.

13. The data reconstruction method based on erasure coding according to claim 1, after acquiring the corresponding data segments from the plurality of source object-based storage devices in accordance with the data offset information, further comprising integrating the data segments into an erasure incremental segment, then the erasure incremental segment is written into the to-be-reconstructed object-based storage device.

14. The data reconstruction method based on erasure coding according to claim 1, wherein, the data offset information comprises an offset start address and an offset data length, the offset start address is data address corresponding to a start position of the incremental data; the offset data length is address length occupied by the entire data of the incremental data.

15. The data reconstruction method based on erasure coding according to claim 1, wherein, the erasure coding evenly stores the data object in respective data disks, and the incremental data is evenly stored in respective data disks.

16. A data reconstruction device based on erasure coding, wherein, the device comprises:
 a memory, for storing a computer program;
 a processor, for executing the computer program to implement the steps of the data reconstruction method based on erasure coding according to claim 1.

17. The data reconstruction device based on erasure coding according to claim 16, wherein, the step of acquiring corresponding data segments from a plurality of source object-based storage devices according to the data offset information comprises:

acquiring an erasure offset start address by equally dividing the offset start address in accordance with the quantity of the data disks, and acquiring an erasure offset data length by equally dividing the offset data length in accordance with the quantity of the data disks;

acquiring the corresponding data segments from the plurality of source object-based storage devices according to the erasure offset start address and the erasure offset data length.

18. The data reconstruction device based on erasure coding according to claim 17, wherein, before the step of acquiring an erasure offset data length by equally dividing the offset data length in accordance with the quantity of the data disks, the method further comprises:

determining whether the offset data length is an integral multiple of an erasure band data length corresponding to the erasure coding;

when the offset data length is an integral multiple of the erasure band data length corresponding to the erasure coding, then performing the step of acquiring an erasure offset data length by equally dividing the offset data length in accordance with the quantity of the data disks;

when the offset data length is not an integral multiple of the erasure band data length corresponding to the erasure coding, then increasing the offset data length to an integral multiple of the erasure band data length, and performing the step of acquiring an erasure offset data length by equally dividing the increased offset data length in accordance with the quantity of the data disks based on the increased offset data length.

19. A non-transitory computer readable storage medium, wherein, the non-transitory computer readable storage medium stores a computer program, the computer program is configured to be executed by a processor to implement the data reconstruction method based on erasure coding according to claim 1.

* * * * *